US007059475B2

(12) United States Patent
Zabka et al.

(10) Patent No.: US 7,059,475 B2
(45) Date of Patent: Jun. 13, 2006

(54) SYSTEM FOR CUSHIONING WAFER IN WAFER CARRIER

(75) Inventors: Michael C. Zabka, Barron, WI (US); Matthew Nicolas, Belle Plain, MN (US); David Molitor, Plymouth, MN (US)

(73) Assignee: Entegris, Inc., Chaska, MN (US)

( * ) Notice: Subject to any disclaimer, the term of this patent is extended or adjusted under 35 U.S.C. 154(b) by 430 days.

(21) Appl. No.: 09/971,352

(22) Filed: Oct. 4, 2001

(65) Prior Publication Data

US 2003/0066780 A1 Apr. 10, 2003

(51) Int. Cl.
*B65D 85/30* (2006.01)
(52) U.S. Cl. .................. 206/710; 206/303; 206/454
(58) Field of Classification Search ........ 206/710–711, 206/303, 454
See application file for complete search history.

(56) References Cited

U.S. PATENT DOCUMENTS

| | | | |
|---|---|---|---|
| 4,606,463 A | 8/1986 | Stavis | 211/13 |
| 5,273,154 A * | 12/1993 | Braun | 206/561 |
| 5,525,791 A | 6/1996 | Krichever et al. | 235/472 |
| 5,553,711 A * | 9/1996 | Lin et al. | 206/710 |
| 5,577,616 A | 11/1996 | Liang | 206/710 |
| 5,586,658 A | 12/1996 | Nyseth | 206/711 |
| 5,697,751 A | 12/1997 | Takahashi | 414/222 |
| 5,803,269 A | 9/1998 | Jacoby et al. | 206/592 |
| 5,816,410 A | 10/1998 | Nyseth | 206/711 |
| 6,070,271 A | 6/2000 | Williams | 2/412 |
| 6,082,540 A | 7/2000 | Krampotich et al. | 206/445 |
| 6,116,684 A | 9/2000 | Williams | 297/214 |
| 6,193,068 B1 * | 2/2001 | Lewis et al. | 206/710 |
| 6,267,245 B1 | 7/2001 | Bores et al. | 206/711 |
| 6,341,695 B1 * | 1/2002 | Lewis et al. | 206/710 |
| 6,533,123 B1 * | 3/2003 | Nakamura et al. | 206/710 |
| 6,550,619 B1 * | 4/2003 | Bores et al. | 206/710 |
| 6,564,946 B1 * | 5/2003 | Lewis et al. | 206/710 |

FOREIGN PATENT DOCUMENTS

WO WO 02/12379 2/2002

* cited by examiner

*Primary Examiner*—Bryon P. Gehman
(74) *Attorney, Agent, or Firm*—Patterson, Thuente, Skaar & Christensen, P.A.

(57) ABSTRACT

The invention relates to transport and shipping containers for wafers that are processed into semiconductor units. The wafer transport system provides wafer carriers that provide damage protection and particulate protection with minimal contamination of the wafers in the shipper. The invention includes a wafer cushion for cushioning semiconductor wafers that is made of a closed-cell polyethylene material with a surface resistivity of less than $5 \times 10^7$ ohms per square that has less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions. The wafer cushion optimally has no detectable outgassing organics under stringent conditions. The static control properties are the result of carbon that is part of the structure of the material.

11 Claims, 3 Drawing Sheets

SYSTEM FOR CUSHIONING WAFER IN WAFER CARRIER

FIELD OF INVENTION

The invention relates to transport and shipping containers for wafers that are processed into semiconductor units. In particular, the invention relates to cushions used to pad wafers in such transporters and shippers.

BACKGROUND

This invention relates to carriers for wafers that are processed into semiconductor units, including enclosures for holding wafers in a horizontal orientation.

Semiconductor wafers are subjected to numerous steps during processing in various pieces of processing equipment. The wafers must be transported from workstation to workstation and often must be temporarily stored in order to accommodate the necessary processing steps. Moreover, the wafers must sometimes be transported or shipped from a wafer manufacturing facility to another site where they are further processed. A number of types of transport and shipping devices have been previously known for handling, storing and shipping wafers. A "coin stack" wafer carrier is a type of shipper that holds the wafers in a horizontal position for transport.

The semiconductor industry is currently moving toward processing larger and larger wafers into semiconductors. As semiconductors have become larger in scale, that is, as the number of circuits per unit area has increased, contaminants in the form of particulates have become more of an issue. The size of particulates that can destroy a circuit has decreased and is approaching the molecular level.

Contaminants besides particulates should also be controlled. Chemical species that coat the wafers can interfere with subsequent processing steps. Charged ions and amines are especially undesirable contaminants. Contaminant and particulate control are necessary during all phases of manufacturing, processing, transporting, and storage of semiconductor wafers.

Wafers must be protected from damage during shipping. The carrier system must protect wafers from breakage and from shocks, for example, as when dropped. An important component of such protection is a wafer cushion on the bottom of the interior of the wafer carrier. The wafer cushion must protect the wafers from breakage but must not contaminate them with particulates and/or chemical species.

Conventional materials used in foam wafer cushions are treated to have static-control properties, including anti-static, static-dissipative, and conductive properties. The wafer cushions are typically manufactured by creating a bulk foam material that is subsequently processed into individual foam cushions. Conventional materials undergo another processing step to endow them with static control properties. Typical treatments involve impregnating the foam material with carbon and/or treating its surface with chemicals.

The semiconductor industry conventionally uses polyurethanes or open-cell polyethylene foams for wafer cushions. These materials are favored because they have good engineering properties and provide generally adequate protection from damage. These cushions, however, outgas ions, amines, and other chemical species that contaminate the wafers. The semiconductor industry needs wafer carriers that provide adequate damage protection and particulate protection without contaminating the wafers in the shipper.

SUMMARY OF THE INVENTION

The wafer transport system of the invention provides wafer carriers that solve these long-felt problems by providing adequate damage protection and particulate protection with minimal contamination of the wafers in the shipper. Part of the solution to these problems involved recognizing that a material suitable for use as a wafer carrier should have inherent static-control properties as opposed to being treated for static control. Treatments involve adding substances to the material that are readily separated from the material. In contrast, a material with inherent static control has more stability and resistance to degassing or throwing off particulates.

A preferred embodiment of the invention is a wafer cushion for cushioning semiconductor wafers that is made of a closed-cell polyethylene material with a surface resistivity of less than $5 \times 10^7$ ohms per square that has less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions. The wafer cushion optimally has no detectable outgassing organics under stringent conditions. A preferred density is approximately 1.5 to 1.9 pounds per cubic foot (pcf) and a preferred compression strength is in the range of 5.0 to 9.0 psi at 10% strain. The static control properties are the result of carbon that is part of the structure of the material. In contrast, other wafer cushions are made from materials that have been surface-treated or that have been impregnated with carbon.

Another preferred embodiment of the invention is a coin stack wafer carrier system for transporting semiconductor wafers that includes wafer cushions described in this patent application. An example a wafer carrier suitable for use in the system of the invention is provided in the U.S. patent application Ser. No. 09/851,499, which is assigned to the same entity as the current application and is hereby incorporated by reference in its entirety.

An embodiment of the system has a wafer carrier base, at least one wafer lateral support, a wafer carrier cover, and at least one wafer cushion. The base and wafer lateral support cooperate to define a wafer stack pocket that the semiconductor wafers can be stacked in. The wafer faces are approximately perpendicular to the lateral support so that the wafers can be transported in a horizontal position. The wafer carrier cover cooperates with the carrier base to traverse the wafer stack pocket and protect it from damage, shocks and particulates. The wafer cushion fits into the wafer stack pocket and has a layer of material that is 2 to 10 mm thick that is made of an energy-absorbing, closed-cell polyethylene foam material having a density of 1.5 to 1.9 pcf, a surface resistivity of less than $5 \times 10^7$ ohms per square, and less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions. The cushion preferably has no detectable outgassing organics as measured under stringent conditions. The static control properties are preferably the result of carbon that is part of the structure of the material.

An embodiment of the invention includes a method of shipping semiconductor wafers. A wafer shipper is prepared and a wafer cushion is prepared for insertion into the wafer carrier. The cushion is made of a closed-cell polyethylene material with a surface resistivity of less than $5 \times 10^7$ ohms per square, less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions, and no detectable outgassing organics under stringent conditions and is inserted into the wafer carrier.

DETAILED DESCRIPTION

The wafer carrier system prevents wafer breakage during wafer transport and provides adequate protection from contamination by particulates and chemical species such as amines and ions. An important part of the system is a wafer cushion that helps to absorb forces applied to the system, especially sudden ones caused by, for example, dropping the shipper. Material properties of the cushion such as compressive strength help to determine the performance of the cushion. The compressive strength of the wafer cushions of the system is preferably approximately 7.0 psi at 10% compression], 9.5 psi at 25% compression, 14.0 psi at 40% compression, and 19.0 psi at 50% compression as measured with the ASTM D3575-91 test.

The wafer carrier system has wafer cushions that have static control properties, namely, having a resistivity of less than approximately $2 \times 10^7$ ohms per square. The static control properties help to prevent an unwanted static electricity discharge. The static control properties are preferably inherent in the material. Inherent means that the materials used to make the foam material have static control properties. Thus a material with inherent static control properties does require treatment with steps intended to confer static control properties, including the step of impregnating or coating the foam with carbon.

The static control properties are preferably related to carbon present in the structure of the material used to make the cushions. "Carbon present in the structure of the material" means that the carbon related to the static-control properties of the material is present in the plastic(s) that define the cells of the foam. The cells of the foam are easily visible under low magnification (e.g., 50×) and are the open spaces in the material that are defined by the solid plastic (polymers) of the material. In contrast, carbon impregnated into the foam does not define cells in the foam.

The wafer carrier system has wafer cushions that minimize contamination from chemical species. The wafer cushions are preferably made of a closed-cell polyethylene foam material that releases a minimal number of chemical species, especially outgassed amines. The cushions of the system have less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions and release no amines that are detectable under stringent conditions.

Figure 1:
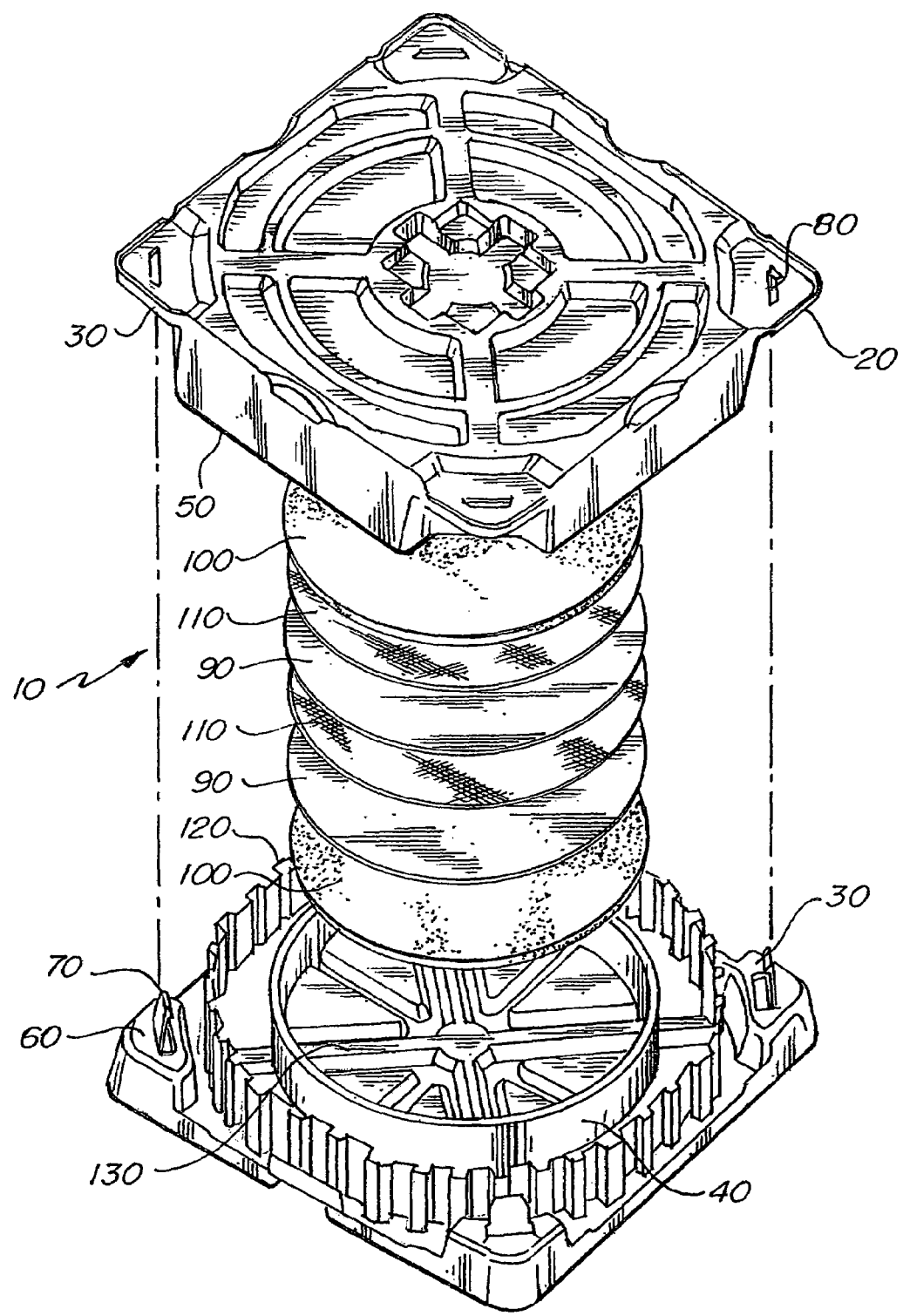
FIG. 1 depicts a perspective view of an embodiment of a system for shipping semiconductor wafers.

A preferred embodiment of a wafer carrier system is shown in FIG. 1. Wafer carrier system 10 has wafer carrier cover 20, wafer carrier base 30, wafer cushions 100 and wafer separators 110. Wafer carrier base 30 has outer wall 120 and piers 60 that have attached latches 70. Wafer lateral support 40 is attached to base 30 to define wafer stack pocket 130. Wafer cover 20 has sides 50 and slots 80 for receiving latches 70. Wafer cushions 100 fit into base 30 and cover 20 to support wafers 90. In use, cushion 100 is placed into base 30 and wafer 90 is placed on cushion 100 with lateral support 40 providing lateral support to wafers 90 that are disposed approximately perpendicularly to lateral support 40. Wafer separator 110 is placed on wafer 90 and wafers and separators are alternated with a wafer cushion 100 placed on top. Wafer cover 20 is placed over base 30 so that wafer stack pocket 130 is traversed and latches 70 engage slots 80.

Figure 2:
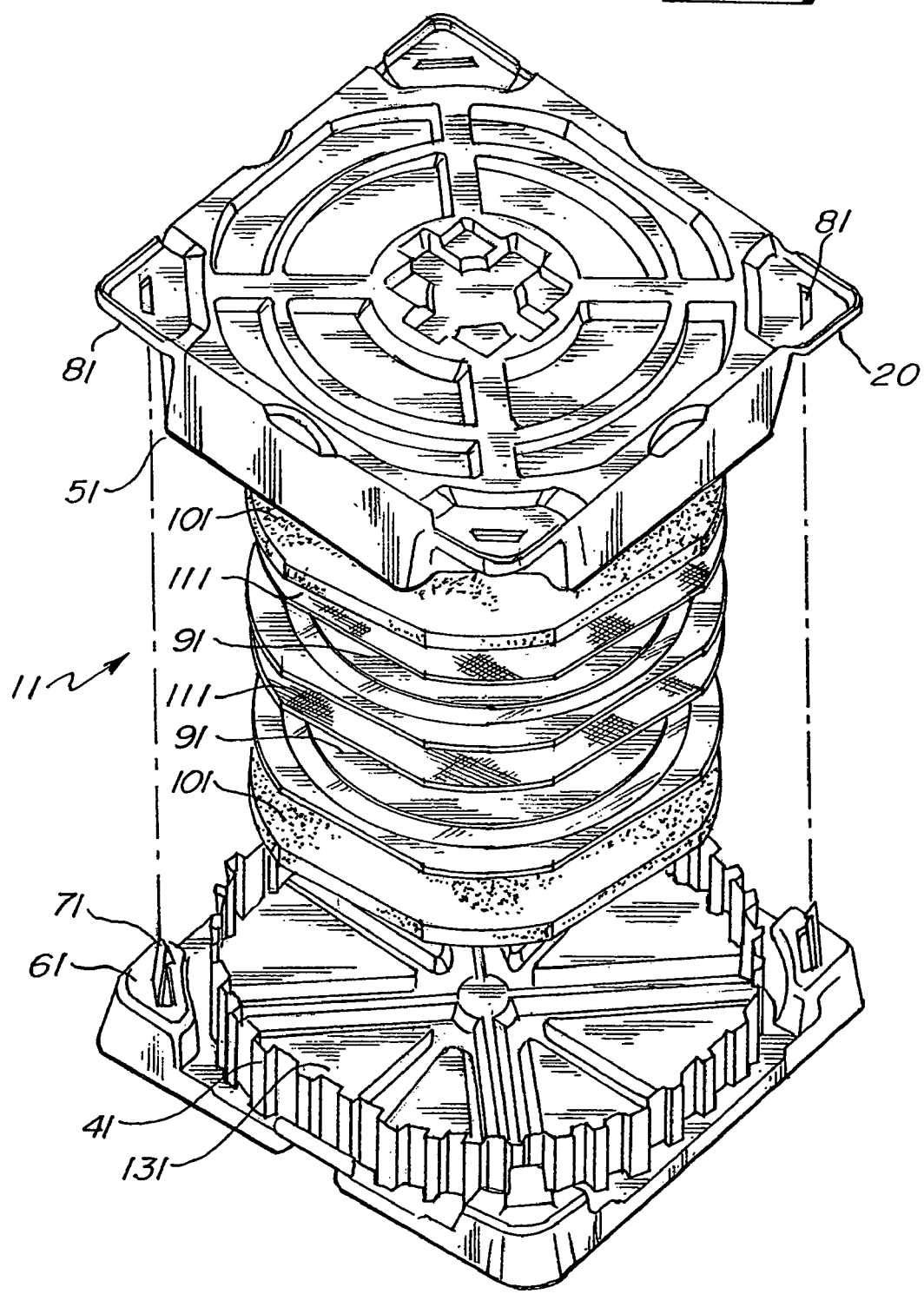
FIG. 2 depicts a perspective view of another embodiment of a system for shipping semiconductor wafers.
Figure 3:
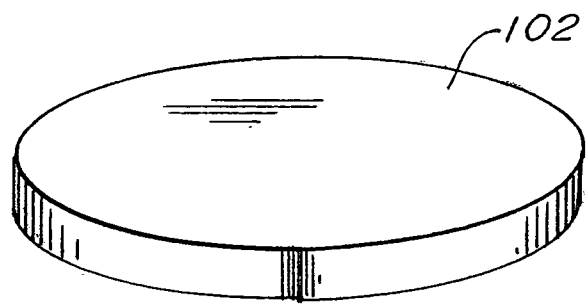
FIG. 3 depicts a perspective view of one embodiment of a wafer cushion.
Figure 4:
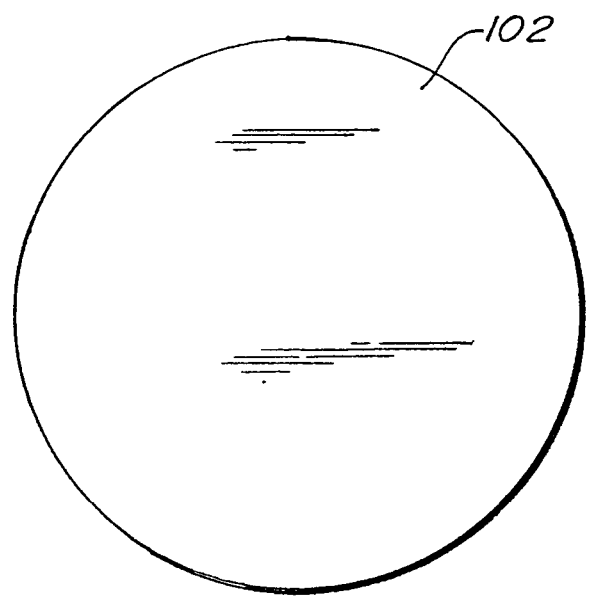
FIG. 4 depicts a plan view of the wafer cushion of FIG. 3.
Figure 5:
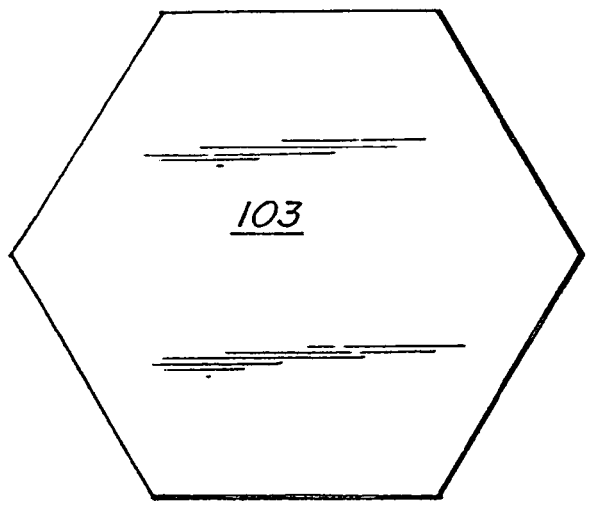
FIG. 5 depicts a plan view of another embodiment of a wafer cushion.

A preferred embodiment of a wafer carrier system is shown in FIG. 2. Wafer carrier system 11 has wafer carrier cover 21, wafer carrier base 31, wafer cushions 101 and wafer separators 111. Wafer carrier base 31 has an outer wall that is formed by lateral support 41 and piers 61 that have attached latches 71. Wafer lateral support 41 is attached to base 31 to define wafer stack pocket 131. Wafer cover 21 has sides 51 and slots 81 for receiving latches 71. Wafer cushions 101 fit into the base 31 and cover 21 to support wafers 91. In use, cushion 101 is placed into base 31 and wafer 91 is placed on cushion 101 with lateral support 41 providing lateral support to wafers 91 that are disposed approximately perpendicularly to lateral support 41. Wafer separator 111 is placed on wafer 91 and wafers and separators are alternated with a wafer cushion 101 placed on top. Wafer cover 21 is placed over base 31 so that wafer stack pocket 131 is traversed and latches 71 engage slots 81.

The wafer cushions may be formed into various shapes as needed to be received by the wafer stack pocket, for example 100, 101, 102, 103 as shown in FIGS. 1–5. Wafer cushions 100–103 are made of a single substantially uniform layer of material that preferably have a thickness of 2 to 10 mm. Wafer cushions 100–103 are made of an energy-absorbing, closed-cell polyethylene foam material preferably having a density of 1.5 to 1.9 pcf, a surface resistivity of less than $5 \times 10^7$ ohms per square, and less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions, and no detectable outgassing organics under stringent conditions.

Other embodiments of wafer cushions will be obvious to those skilled in these arts after reading this disclosure and include multiple layers, alternative shapes, other thicknesses, and other surface configurations, for example bumps, indentations, holes, and grooves. Wafer cushions of the invention may be shaped according to a variety of means known to skilled artisans, including die-cut, molding, slitting, extrusions, skiving, and use of hot wires. A preferred material for use as wafer cushions is a closed cell polyethylene trademarked as PLASTAZOTE by ZOTEFOAM Industries. Moreover, the wafer cushions are adaptable to most wafer carrier systems.

EXAMPLE 1

Procedures for Testing for Ion Release Under Moderate Conditions

This example details the testing for ion release under moderate conditions. The method leaches materials with ultra-pure DI water for anion and cation analysis by ion chromatography.

The tests were performed using: Re-pipetter (RAININ) and corresponding tips or equivalent; Class 100 Laminar Flow Hood; PRECISION 180 Series Hot Water Bath or equivalent; Lead Ring Weights; 125-ml Polypropylene (PP) sample bottles; 18-MW/cm deionized water; 1000 ppm standards of fluoride, acetate, formate, chloride, nitrite, bromide, nitrate, sulfate, phthalate, phosphate, lithium, ammonium, sodium, potassium, magnesium, and calcium.

"ppb" is defined as one nanogram per milliliter, (µg/ml); "ppm" is defined as one microgram per milliliter, (µg/ml). Clean class 10 nitrile gloves are worn while performing this procedure and as much sample preparation as was reasonably possible was performed in the class 100 laminar flow hood. All dedicated labware was leached with 18-MW/cm deionized water for at least 24 hours before use. All labware was triple-rinsed with 18-MW/cm deionized water prior to use.

The testing was performed according to the following procedure: Turn on hot water bath and set for 85° C. Label 125-ml PP screw capped bottles with tape as follows: Lch Blk, Sample #1, Sample #2, etc. (a leach blank must be prepared for each set of samples analyzed. Using a clean stainless steel scissors cut an insert into approximately (1 cm×1 cm×1 cm) pieces. Accurately weigh approximately 0.5 grams of the cut up sample and place in 125-ml PP screw capped bottles. Record the exact mass for each sample. Add exactly 50.0 ml of 18-MW/cm deionized water to the sample bottles. Add exactly 50.0 ml of 18-MW/cm deionized water to an empty 125-ml PP bottle to provide a blank. Place ring weights over the lids of the sample and blank bottles and place in the hot water bath. Allow to leach for one hour. Remove the samples and blank from the hot water bath and place in a room temperature water bath. Allow samples and blank to cool for at least ten minutes in the room temperature water bath. Decant the samples and blank into fresh, clean labeled 125-ml PP bottles for storage until the analysis is performed.

Analysis was performed by ion chromatography using calibration standards prepared at 25.0, 75.0, and 150.0 ng/ml. Regression coefficients of greater than 0.999 were required for each calibration curve. The following quality control procedures were followed: A calibration verification standard, (prepared from a different stock of standards than that for the calibration standards), is analyzed at the front of the run to verify the calibration standards and the current calibration (Recoveries of +/−10% are required); a continuing calibration verification standard is analyzed every tenth sample and at the end of the run to verify instrument stability (Recoveries of +/−10% are required); a blank is analyzed at the front of the run, every tenth sample, and at the end of the run to verify no carry-over is occurring; a sample of the DI water used for sample preparation is analyzed to verify its cleanliness. Data reduction was performed as follows: a blank was prepared and analyzed for each analysis; the results from the blank were subtracted from the sample results; the results from the instrument (in ng/ml) were multiplied by the volume of leachate used, (50 ml), and divided by the mass of the sample to reach the units of ng/g.

EXAMPLE 2

Results of Testing for Ion Release Under Moderate Conditions

The procedures of example 1 were followed while analyzing multiple materials, including the following four materials: closed cell static-controlled polyethylene (PLASTAZOTE from ZOTEFOAM incorporated, Surrey, England); open cell anti-static polyurethane; corrugated conductive anti-static closed cell cross-linked high density crosslinked polyethylene (CELLUPLANK); and closed cell anti-static polyethylene (CELLUPLANK). The results are tabulated in Table 1. Significantly, only one material provided less than 1800 ng/g Cl−, 400 ng/g F−/Acetate, 270 ng/g $NO_3^-$, 350 ng/g $SO_4^{2-}$, and 60 ng/g $PO_4^{3-}$ ions leachable under moderate conditions.

TABLE 1

Results for Foam Testing

| Leached Ions ng/g | Closed cell polyethylene PLASTAZOTE | Open cell polyurethane | High density polyethylene | Closed cell polyethylene CELLUPLANK |
|---|---|---|---|---|
| Cl− | 1600 | 2000 | 4200 | 7200 |
| F−/Acetate | 220 | 850 | 1500 | 97000 |
| $NO_3^-$ | 210 | 220 | 280 | approx 2500 |
| $SO_4^{2-}$ | 300 | 370 | 370 | approx 2500 |
| $PO_4^{3-}$ | <50 | <50 | 110 | 50000 |
| Outgassed organics | | Amines present | | Amines present |

EXAMPLE 3

Organic Outgassing Analysis by Gas-Chromatography-Mass Spectrometry

This example details procedures for measuring organic outgassing under stringent conditions. The method uses an automated thermal desorbtion unit (ATD) and analyzed via gas-chromatography-mass spectrometry (GC-MS). See also Thermal Desorbtion Gas Chromatograph, FGTM 1350. The following materials are required: Automatic Thermal Desorbtion Unit; Thermal Desorbtion Sample Tubes (glass); Thermal Desorbtion Sample Tubes (stainless steel) (SUPELCO P/N 255055); Thermal Desorbtion Sample Tubes (glass) (SUPELCO P/N 25090-U); 500 ppm heptane in methanol certified standard Gasoline Range Organic Standard. The following definitions apply: ppb is one nanogram per milliliter, (ng/ml); ppm is one microgram per milliliter, (µmg/ml). Note: Always wear clean Class 10 nitrile gloves while performing this procedure.

Personnel proceed as follows for equipment and sample preparation: Place a stainless steel ATD tube on the balance and tare; Using a clean stainless steel scissors cut an insert into approximately (1 mm×1 mm×1 mm) pieces; Using a tweezers, place 0.05 grams of sample into the tube, pieces should fit loosely so as not to block the desorbtion flow; Place caps on both ends of the tube; The tubes are placed on the ATD unit and desorbed at 100° C. for 30 minutes.

Personnel proceed as follows for analysis via ATD GC-MS and quality control: 0.2 ml of a GRO standard is injected into glass tubes containing TENAX TA and used as the independent calibration standard; Calibration verification standards are analyzed at the front of the run to verify the independent calibration standard and the current calibration (Recoveries of +/−10% are required); A continuing calibration verification standard is analyzed every tenth sample and at the end of the run to verify instrument stability (Recoveries of +/−10% are required); A blank is analyzed at the front of the run, every tenth sample, and at the end of the run to verify no carry-over is occurring; Sample of known concentrations are analyzed to verify results Data Reduction is performed as follows: A blank is prepared and analyzed for each analysis. The results from the blank are subtracted from the sample results. The results from the instrument are calculated as follows: Concentration=(0.1 mg)(total peak area sample) with results reported in the units of mg/g.

EXAMPLE 4

Results of Organic Outgassing Analysis

The procedures of Example 3 were followed while analyzing multiple materials, including the following four materials: closed cell static-controlled polyethylene (PLASTAZOTE from ZOTEFOAM incorporated, Surrey, England); open cell anti-static polyurethane; closed cell cross-linked high density crosslinked anti-static polyethylene; and closed cell anti-static polyethylene (CELLUPLANK). The results are tabulated in the bottom row of Table 1. Significantly, a plurality of closed cell polyethylene materials were tested but only one of them provided an undetectable amount of outgassed amines.

The invention claimed is:

1. A wafer cushion, for cushioning semiconductor wafers in a carrier, made of an energy-absorbing material thick enough and with a compressive strength suitable to absorb energy applied to the carrier by a sudden shock caused by dropping the carrier, the cushion comprising
an approximately circular shape for disposition in a coin stack wafer carrier pocket dimensioned to accommodate an approximately circular semiconductor wafer, with the wafer cushion being made of closed-cell polyethylene material with a compressive strength of about 5 to about 9 psi at 10% strain and a surface resistivity of less than $5 \times 10^7$ ohms per square, less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions, and no detectable outgassing organics under stringent conditions, wherein the closed-cell polyethylene has carbon present as part of the structure of the material to inherently provide the surface resistivity in the absence of carbon black.

2. The wafer cushion of claim 1 wherein the closed-cell polyethylene material has a density of 1.5 to 1.9 pcf.

3. The wafer cushion of claim 1 wherein the closed-cell polyethylene material has a compression strength in the range of 5.0 to 9.0 psi at 10% strain.

4. A system for transporting semiconductor wafers that have two parallel faces separated by a thickness, the system being a coin stack wafer carrier comprising:
a plurality of wafers arranged in a stack, a coin stack wafer carrier base having at least one wafer lateral support, a wafer carrier cover, and a pair of wafer cushions;
the coin stack wafer carrier base and wafer lateral support cooperating to define a wafer stack pocket that is approximately circular and configured to receive the stack of wafers, with the wafers being approximately circular semiconductor wafers with the parallel wafer faces approximately perpendicular to the lateral support; the wafer carrier cover being configured to cooperate wit the wafer carrier base to traverse the wafer stack pocket;
each wafer cushion being approximately circular and configured to be received by the wafer stack pocket and comprising a substantially uniform layer that is made of an energy-absorbing, closed-cell polyethylene foam material having a density of 1.5 to 1.9 pcf, a surface resistivity of less than $5 \times 10^7$ ohms per square, less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions, and no detectable outgassing organics under stringent conditions,
wherein the wafer cushions are located in the stack pocket with the stack of the semiconductor wafers being in the stack pocket intermediate the pair of wafer cushions and the closed-cell polyethylene foam has carbon present as part of the structure of the material to inherently provide the surface resistivity in the absence of carbon black.

5. The system of claim 4 wherein the closed-cell polyethylene material has a density of 1.5 to 1.9 pcf.

6. The system of claim 5 wherein the closed-cell polyethylene material has a compression strength in the range of 5.0 to 9.0 psi at 10% strain.

7. The system of claim 4 further comprising a wafer separator disposed between a pair of the wafers in the stack of wafers.

8. A method of transporting semiconductor wafers comprising preparing a coin stack wafer carrier and a pair of wafer cushions for cushioning semiconductor wafers, and inserting a stack of semiconductor wafers into the wafer carrier with one of the pair of wafer cushions being on top of the stack and the other of the pair of wafer cushions being on the bottom of the stack, the cushions being made of closed-cell polyethylene material with a compressive strength of about 5 to about 9 psi at 10% strain and a surface resistivity of less than $5 \times 10^7$ ohms per square, less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions, and no detectable outgassing organics under stringent conditions, wherein the closed-cell polyethylene has carbon present in the structure of the material to inherently provide the surface resistivity in the absence of carbon black.

9. A method of making cushions for use with transporting semiconductor wafers, the method comprising providing a closed-cell polyethylene foam material having a surface resistivity of less than $5 \times 10^7$ ohms per square, less than 1800 ng/g $Cl^-$, 400 ng/g $F^-$/Acetate, 270 ng/g $NO_3^-$, 350 ng/g $SO_4^{2-}$, and 60 ng/g $PO_4^{3-}$ ions leachable under moderate conditions, and no detectable outgassing organics under stringent conditions and using means for shaping the foam material to a thickness of 2 to 10 mm and an approximately circular shape to fit in a coin-stack wafer shipper, wherein the closed-cell polyethylene foam material has carbon present in the structure of the material to inherently provide the surface resistivity in the absence of carbon black.

10. The wafer cushion of claim 9 wherein the foam material has a density of 1.5 to 1.9 pcf.

11. The wafer cushion of claim 9 wherein the foam material has a compression strength in the range of 5.0 to 9.0 psi at 10% strain.

* * * * *

UNITED STATES PATENT AND TRADEMARK OFFICE
CERTIFICATE OF CORRECTION

PATENT NO.        : 7,059,475 B2
APPLICATION NO. : 09/971352
DATED             : June 13, 2006
INVENTOR(S)       : Michael C. Zabka, Matthew Nicolas and David Molitor It is certified that error appears in the above-identified patent and that said Letters Patent is hereby corrected as shown below:

Col. 5, line 1, delete ($\mu$g/ml), and insert --ng/ml--

Col. 7, line 55, delete "wit" and insert --with--

Signed and Sealed this

Nineteenth Day of December, 2006

JON W. DUDAS
*Director of the United States Patent and Trademark Office*